United States Patent [19]
Roth

[11] Patent Number: 5,278,558
[45] Date of Patent: Jan. 11, 1994

[54] HIGH ACCURACY DIGITAL TO ANALOG CONVERTER ADJUSTMENT METHOD AND APPARATUS

[75] Inventor: Walter J. Roth, Marion, Iowa

[73] Assignee: Rockwell International Corporation, Seal Beach, Calif.

[21] Appl. No.: 918,348

[22] Filed: Jul. 21, 1992

[51] Int. Cl.⁵ .................. H03M 1/06; H03M 1/66
[52] U.S. Cl. .................. 341/120; 341/118; 341/139; 341/144
[58] Field of Search ............. 341/120, 118, 139, 144

Primary Examiner—Sharon D. Logan
Attorney, Agent, or Firm—Kyle Eppele; M. Lee Murrah; H. Frederick Hamann

[57] ABSTRACT

An apparatus and method of calibrating a digital to analog converter including means for establishing and storing a minimum and maximum analog endpoint value slightly in excess of the desired operating range of the DAC and then scaling each respective raw data point of the DAC within the established endpoint values.

9 Claims, 3 Drawing Sheets

HIGH ACCURACY DIGITAL TO ANALOG CONVERTER ADJUSTMENT METHOD AND APPARATUS

This invention was made with Government support under Contract No. F34601-84-C-0611 awarded by the U.S. Air Force. The Government has certain rights in this invention.

BACKGROUND OF THE INVENTION

The present invention relates to digital-to-analog converters (DAC) and more specifically to the adjustment of such devices to compensate for errors.

Digital to analog conversion describes the process of taking a value represented in digital code and converting it to an analog signal proportional to the digital value. A variety of commercially available DACs are offered by numerous semiconductor manufacturers and electronic distributors for a wide variety of applications. DAC complexity, operating speed, and resolution is dependent upon numerous items such as internal construction, operating environment and complimentary circuitry.

The ideal DAC would be able to consistently quantitize any respective digital input to an accurate analog equivalent. In actuality deviations from the ideal operating DAC occur due in part to offset preamp voltage and voltage drop in the current path internal to the DAC. These errors are often aggravated by temperature fluctuations in the relevant operating environment.

Current DAC adjustment techniques for the above described situation focus upon calibration of the DAC at the zero and the maximum output signal levels. In applications requiring full-range accurate endpoints, current adjustment methods are deficient.

The present invention disclosed and claimed by Applicant describes a method and apparatus for improving overall accuracy of DAC performance throughout its intended operational range.

SUMMARY OF THE INVENTION

The present invention provides for adjustment of a digital to analog converter having improved accuracy over apparatus and methods as known in the prior art. Utilizing a DAC and a plurality of comparators in conjunction with a controller/counter and knowing the desired full range of analog output, one intentionally adjusts DAC gain and offset higher than normally done in the prior art. This adjustment guarantees the DAC output capability is a superset of the desired analog range under all operating environments. Through the use of comparators, equivalent digital inputs to the desired analog endpoints are determined. The controller then uses the two digital endpoint representations to develop a scaling factor which is applied to raw digital inputs to compensate the DAC gain and offset settings. Having correlated the digital inputs very closely to the two desired analog endpoints, the inherently linear operation of the DAC provides for accurate operation throughout the operating range of the DAC. Gain and offset stability over temperature achieved using conventional temperature compensation techniques allow tighter tolerance setting of DAC gain and offset nearer to ideal while still providing the needed excessive analog range capability minimizing loss of DAC resolution. This present invention provides a very accurate dynamic adjustment of any DAC between two operation endpoints under all environmental conditions.

It is an object of the present invention to provide an apparatus for accomplishing highly accurate digital to analog conversion.

It is yet another object of the present invention to provide a method for accomplishing highly accurate digital to analog conversion.

It is a feature of the present invention to utilize a circuitry that establishes DAC endpoint values slightly in excess of the desired operating range.

It is an advantage of the present invention that the DAC adjustment provides superior performance for those applications requiring precise calibration at both endpoints and all intermediate values.

These and other objects, features and advantages are disclosed and claimed in the specification, figures and claims of the present application.

DETAILED DESCRIPTION OF THE FIGURES

Figure 1:
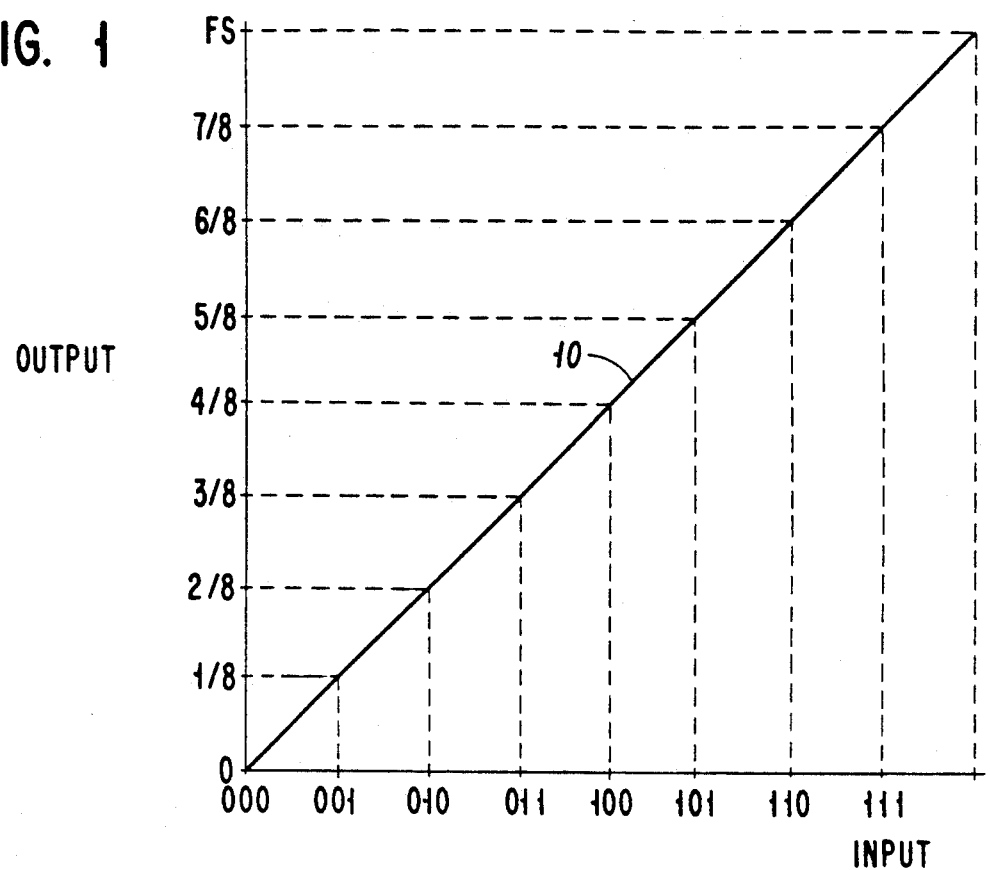
FIG. 1 illustrates an ideal transfer function for a 3-bit DAC, well known in the prior art.

Referring now to the Figures wherein like items are referenced as such throughout. FIG. 1 shows a graphic representation of the output function of an ideal 3-bit DAC as known in the prior art. Since a 3-bit DAC has only 8 discrete input codes which correspond to 8 different output levels, no other output levels can exist and it is plotted as curve 10. The binary inputs are shown on the abscissa and the output comprises the ordinate. The analog output of an n bit DAC is related to its binary input by the following equation:

$$E_o = FS(A_1 2^{-1} + A_2 2^{-2} + \ldots + A_n 2^{-n})$$

where the term FS is defined as the nominal Full-Scale output of the DAC and it is known as the unreachable Full Scale, $A_1 2^{-1}$ is the most significant bit (MSB), and $A_n 2^{-n}$ the least significant bit (LSB). It is apparent that the actual Full-Scale output of the DAC, $E_{FS}$, with all the input bits "1" is given by the following equation.

$$E_{FS} = FS(2^{-1} + 2^{-2} + \ldots + 2^{-n}) = FS(1 - 2^{-n})$$

The term $FS(\frac{1}{2}^n)$ is the smallest output level that the DAC can resolve and it is known as the 1 LSB output level change. It is universal practice that the input code of a DAC is written in the form of binary integer with the fractional nature of the corresponding number understood. Curve 10 connecting the Zero point and FS point is called the Gain Curve.

Figure 2:
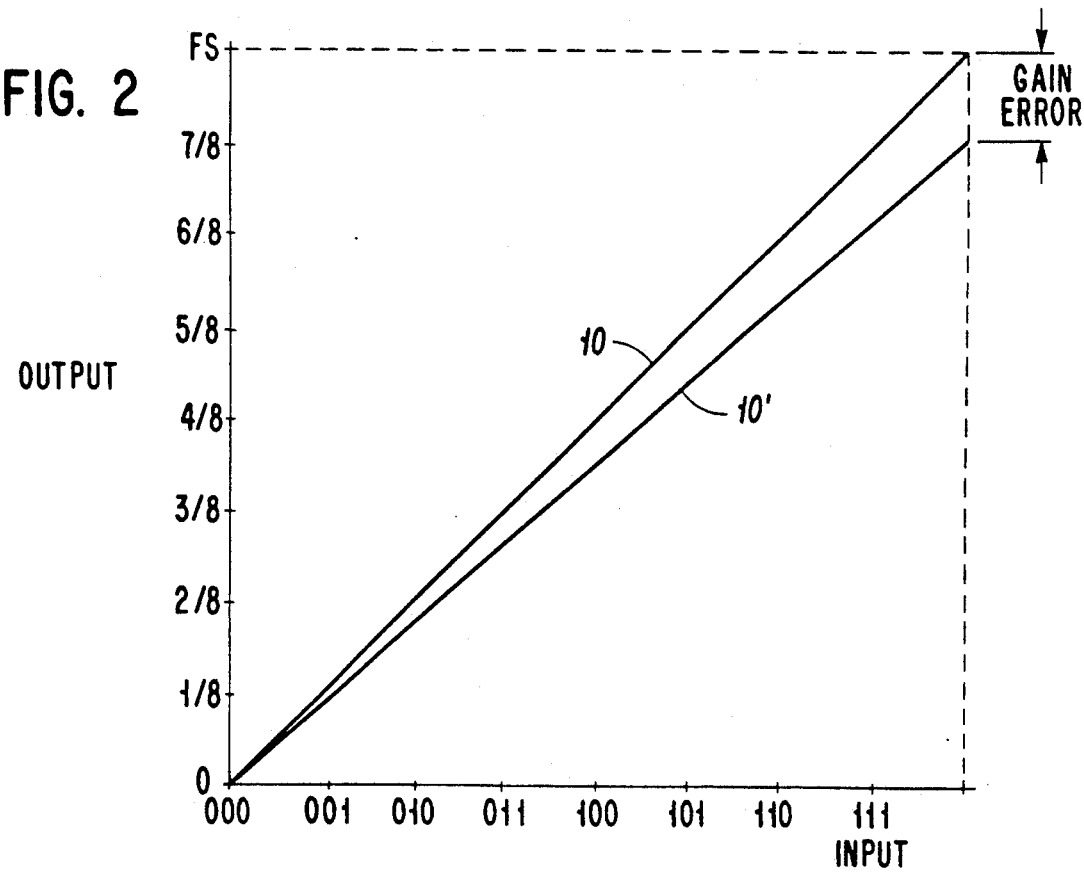
FIG. 2 illustrates representative gain error contrasted to an ideal response for a 3 bit DAC, well known in the prior art.
Figure 3:
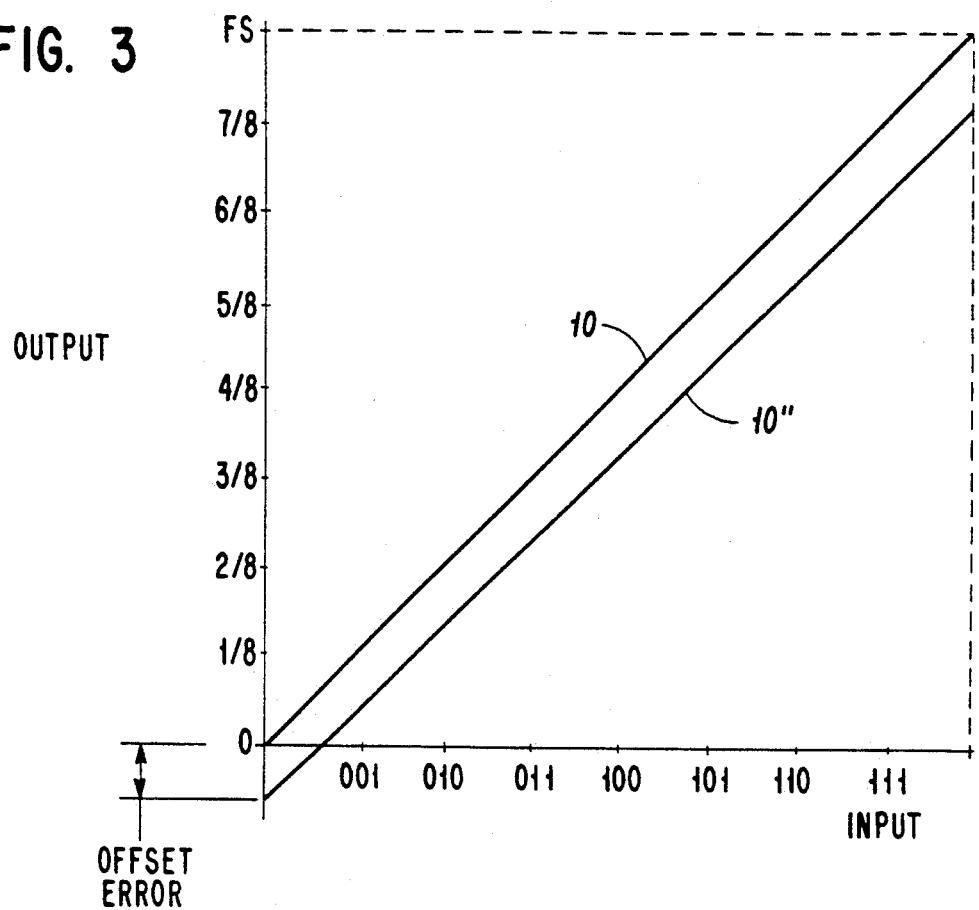
FIG. 3 illustrates representative offset error contrasted to ideal response for a 3 bit DAC, well known in the prior art.

FIGS. 2 and 3 illustrate gain error and offset error, respectively, in a typical 3-bit DAC. The gain error plot illustrates the measure of change in full scale analog output, with all bits "1's", the offset error illustrates the non-zero input of the analog input signal when all bits are set to "0". Curve 10' and 10" represent the deviation associated with gain and offset error, respectively, from the ideal DAC performance curve 10.

Figure 4:
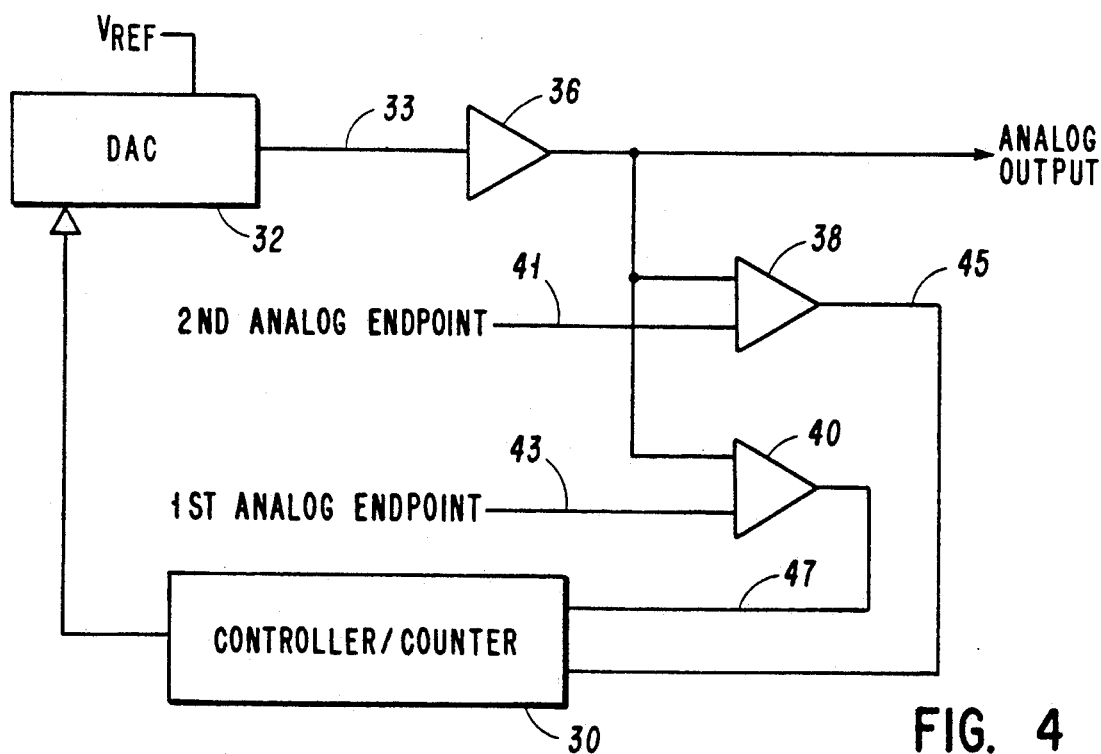
FIG. 4 illustrates one embodiment of the apparatus of the present invention.

One embodiment of the present invention is illustrated in FIG. 4. A controller 30, having counter capability, is shown coupled to a DAC 32, thereby providing a digital input to the DAC. The DAC and controller may be any commercially available devices such as Analog Devices Corporation, Norwood, MA DAC AD7534 and Intel Corporation, Santa Clara, Calif. controller 87C51. It should be noted that alternative devices including separate counters could also be used in the support circuitry. DAC 32 also is shown having a reference voltage $V_{ref}$ and an output 33 coupled to amplifier 36. Amplifier 36 serves to convert the DAC current output to a voltage, such voltage being coupled to comparators 38 and 40 and on to additional processing circuitry (not shown). Comparator 40 receives a reference input 43, representing a first analog endpoint, while comparator 38 receives a second analog endpoint as a reference input, 41. The comparator output signals 45 and 47 are each coupled to controller 30.

The comparators 38 and 40 indicate when the DAC analog output is at the desired analog endpoints. The controller uses the digital equivalents of these endpoints as minimum and maximum operating points for DAC operation. Knowing the effective digital endpoints, the controller can then scale raw digital DAC inputs to produce corrected data to operate the DAC.

Although the illustration of FIG. 4 depicts two comparators, an alternate embodiment using an analog switch between the two analog endpoints could be used thereby allowing the use of a single comparator. The state of the analog switch could then be readily controlled by logic data lines or a separate output from the controller.

Best DAC operation, in this instance defined as minimal impact to resolution, results when the DAC gain curve approaches unity. To achieve smaller gain variation while guaranteeing at least unity gain over a wide range of temperatures, compensation networks for both offset and gain are suggested. Thermistor networks included in the DAC amplifier provide such performance.

The present invention teaches introducing slightly higher than unity DAC voltage gain, for calibration purposes. The actual minimum gain required depends on the expected maximum DAC offset error and the maximum expected inherent DAC gain variation for a specific operating environment. The goal is to cause the DAC extreme values, also referred to as all ones or all zeroes, to fall slightly outside the desired operating voltage range. The following example will serve to illustrate this point.

For purposes of this example use of a 14 bit DAC configured for bipolar operation is assumed. It is understood that the principles disclosed herein are equally applicable to DACs having various bit resolutions, bipolar or unipolar configurations, or other characteristics and should not be construed to only apply to 14 bit bipolar DACs. The initial determination in the adjustment method is to select a maximum analog endpoint value $V_{MAX}$ for the DAC. This value is normally established by the system that employs the DAC and for purposes of this example has been determined to be equal to +8.6 volts. Next, a maximum anticipated voltage offset is determined, ±5 mV in this case. Since a bipolar DAC configuration was assumed the example may be simplified using symmetry, resulting with a minimum analog endpoint value, $V_{MIN}$, of −8.6 volts. This value is also a function of the system and need not be equal to the negative of $V_{MAX}$. Using standard equations for a symmetrical bipolar DAC $V_{OUT}$, the analog output of the DAC is determined in accordance with the following equation:

$$V_{OUT} = (V_{ref}(D_{IN} - 2^{N-1})/2^{N-1}) * Gain + Offset$$

Where $D_{IN}$ = integer input to DAC in the range of $0 \leq D_{IN} \leq 2^N$

N = bit resolution of the DAC = 14

Using $V_{REF} = V_{MAX} = -V_{MIN}$ and

Solving for Gain yields:

$$Gain = (V_{OUT} - Offset) \, 2^{N-1}/(V_{ref}*(D_{IN} - 2^{N-1}))$$

Solving Gain for the all 0's input case:

$$\begin{aligned} Gain &= (-8.6 - (+5 \, mv)8192/(8.6(0-8192)) \\ &= 1.0006 \end{aligned}$$

This gain represents the minimum required to overcome the assumed offset and guarantee the DAC output capability exceeds the $V_{MIN}$ to $V_{MAX}$ range.

Upon determination of minimum required gain, an estimate of gain variation due to changes in operational environment is made. In the specific example, the implementation of temperature compensation techniques limits the expected gain variation to ±0.25%. Because of this expected variation in gain, the DAC is adjusted for a nominal gain of 1.0006/(1−0.25%) = 1.0031 to guarantee the minimum gain requirement is never breached.

Since DAC input data is dynamically matched to the operating voltage range, there is no longer any concern of the DAC analog voltage exceeding the system limits of $V_{MIN}$ to $V_{MAX}$ at any time. For example, in a servo system application the DAC would never provide an analog output signal that would cause the servo system to reach mechanical end links.

Figure 5:
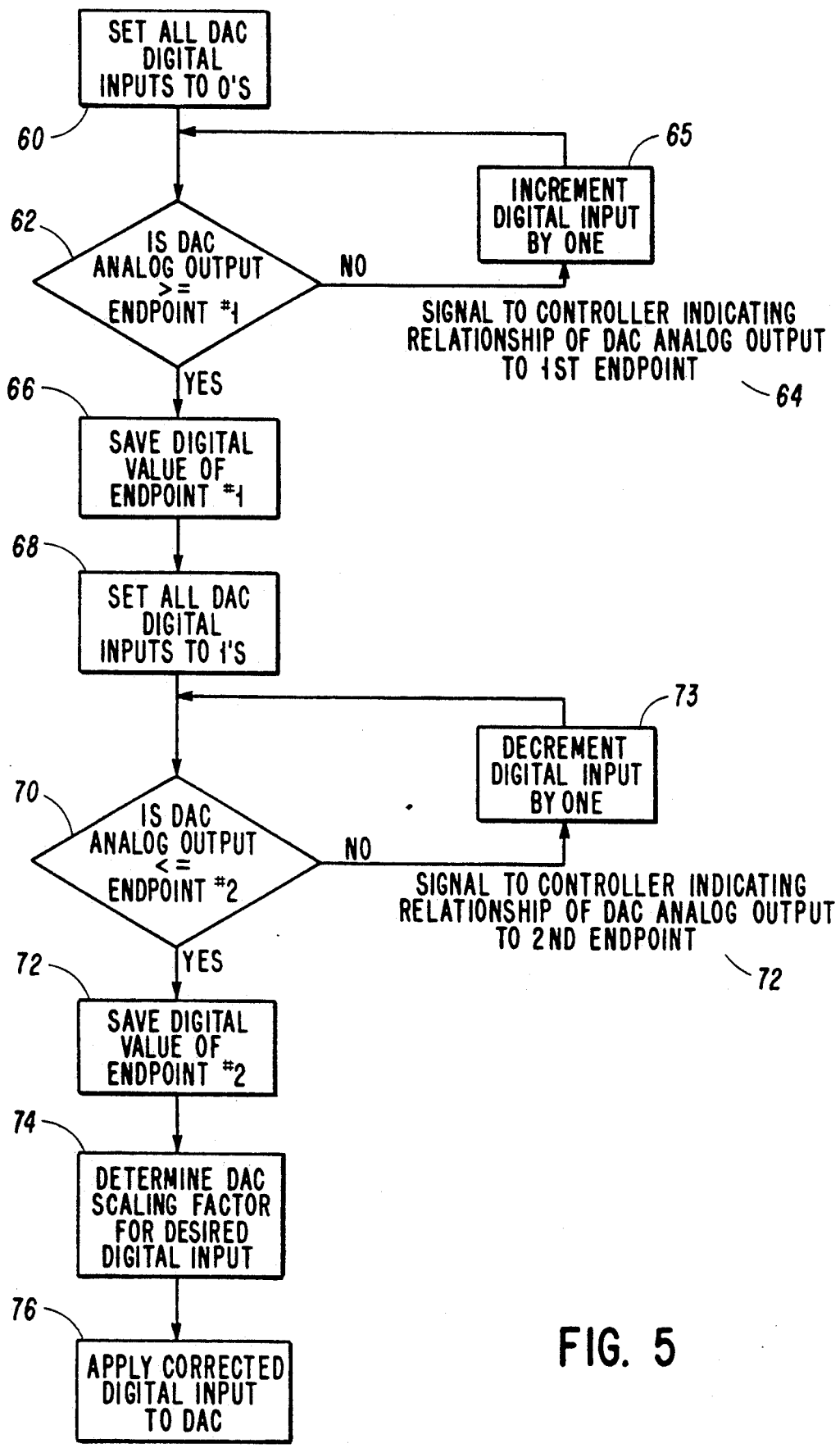
FIG. 5 illustrates a flow chart depicting the method of DAC adjustment of the present invention.

One embodiment of the methods disclosed herein is represented by the flow chart of FIG. 5. Use of a DAC that has had its gain adjusted to a value greater than one is assumed. Steps 60 through 66 establish the equivalent digital input value that represents a first analog endpoint or $V_{MIN}$. The method sets the digital input to the DAC to all zeroes, step 60. In step 62, comparator 40 tests whether the DAC analog output exceeds the first analog endpoint, $V_{MIN}$. If not, the controller causes the counter to increment the digital input to the DAC by 1, steps 64 and 65, respectively. The test of step 65 repeats and the process loops until the DAC analog output exceeds the threshold of the first analog endpoint. The first DAC input value that satisfies the test of step 65 is stored, step 66, for later use as an argument in determining how to scale raw input data. The digital equivalent DAC input for $V_{MAX}$ or a second analog endpoint is similarly determined in steps 68 through 72. This loop, however, begins with an initial DAC input of all ones and proceeds by decrementing that input until the DAC output reaches the second analog endpoint, $V_{MAX}$ threshold value as indicated by comparator 38. The first DAC input value that satisfies the test of step 70 is stored, step 72, for use as an argument in determining how to scale raw input data. Step 74 determines the corrected digital input $D_{SCALED}$, to the DAC based on the raw digital input (uncorrected data value), $D_{IN}$, the result of step 66 $D_{MIN}$ and the result of step 72, $D_{MAX}$.

$$D_{SCALED} = D_{MIN} * (1 - D_{IN}/(2^N - 1)) + D_{MAX} * D_{IN}/(2^N - 1)$$

The scaled data is then applied as corrected data at the input to the DAC in step 76. Utilization of a DAC having superior linearity would provide optimum accuracy.

It is thought that the apparatus and method of the present invention and many of its attendant advantages will be understood from the foregoing description, and it will be apparent that various changes may be made in the form, construction and arrangement of the parts and the steps thereof without departing from the spirit and scope of the invention, or sacrificing all their material advantages, the forms described herein being merely preferred embodiments thereof.

I claim:

1. An apparatus for calibrating a digital to analog converter, comprising:
    means for establishing a maximum output signal in slight excess of a desired operating range of the digital to analog converter;
    means for establishing a minimum output signal in slight excess of the desired operating range of the digital to analog converter; and
    means for scaling incremental digital to analog converter settings complimentary with the maximum and minimum output signals.

2. The apparatus of claim 1 wherein the means for establishing the maximum and minimum analog output signals comprises a pair of comparators.

3. The apparatus of claim 1 wherein the means for establishing the maximum and minimum analog output signals comprises an analog switching means and comparator.

4. The apparatus of claim 1 wherein the scaling means is comprised of a controller-counter device.

5. The apparatus of claim 1 further comprising temperature compensation means.

6. The apparatus of claim 1 further comprising means for establishing a gain value greater than one.

7. A method of calibrating a digital to analog converter comprising the steps of:
    adjusting gain of the digital to analog converter to a value greater than one to establish an analog output capability encompassing a desired output range;
    establishing a digital equivalent value of a first analog endpoint slightly in excess of a desired operating minimum value;
    storing the established digital equivalent value of the first analog endpoint;
    establishing a digital equivalent value of a second analog endpoint slightly in excess of the desired operating maximum value;
    storing the established digital equivalent value of the second analog endpoint;
    establishing a digital equivalent value of the second analog endpoint;
    scaling raw data points of the digital to analog converter within the established first and second analog endpoints in order to determine a scaled factor; and
    applying the scaled factor to the digital to analog converter input.

8. The method of claim 7 wherein the step of establishing a first analog endpoint comprises the steps of:
    setting all digital to analog converter digital inputs to zero;
    determining if the digital to analog converter analog output is greater than or equal to the first analog endpoint;
    signalling a controller means indicating a relationship of the digital to analog converter analog output as an intermediary analog endpoint;
    incrementing the digital input by one;
    repeating the determining and signalling step until the digital value of the first analog endpoint is reached.

9. The method of claim 7 wherein the step of establishing a second analog endpoint comprises the steps of:
    setting all digital to analog converter digital inputs to one;
    determining if the digital to analog converter analog output is less than or equal to the second analog endpoint;
    signalling a controller means indicting a relationship of the digital to analog converter analog output as an intermediary analog endpoint;
    decrementing the digital input by one;
    repeating the determining and signalling step until the digital value of the second analog endpoint is reached.

* * * * *